(12) United States Patent
King et al.

(10) Patent No.: US 6,208,027 B1
(45) Date of Patent: Mar. 27, 2001

(54) TEMPORARY INTERCONNECT FOR SEMICONDUCTOR DEVICES

(75) Inventors: Jerrold Lynn King, Highley, AZ (US); Mohammad Khan, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/281,521

(22) Filed: Mar. 30, 1999

Related U.S. Application Data

(60) Provisional application No. 60/123,632, filed on Mar. 10, 1999.

(51) Int. Cl.[7] .......................... H01L 23/48; H01L 23/52; H01L 29/40
(52) U.S. Cl. .......................... 257/737; 257/738; 257/778; 257/772
(58) Field of Search .................... 257/737, 738, 257/772, 778; 438/613–617; 228/180.22

(56) References Cited

U.S. PATENT DOCUMENTS 5,457,879 * 10/1995 Gurtler et al. .......................... 29/895
5,929,521 * 7/1999 Wark et al. .......................... 257/737

* cited by examiner

*Primary Examiner*—Mahshid Saadat
*Assistant Examiner*—Jhihan B Clark
(74) *Attorney, Agent, or Firm*—Brinks Hofer Gilson & Lione

(57) ABSTRACT

The present invention discloses a bump nest which allows a semiconductor device to be temporarily connected with a package without having to be fused to the package. The disclosed temporary interconnect includes a contact group comprising at least three projecting contact elements. Each of the respective contact elements includes a projecting contact guide, which is concentrically located on an encircling contact. The projecting contact guides and the encircling contact are spaced in a manner so as to surround a ball or a bump of the semiconductor device. In the preferred embodiment, the temporary interconnect may also include a base pad on which each of the encircling contacts is accurately positioned to surround the ball or bump.

10 Claims, 3 Drawing Sheets

TEMPORARY INTERCONNECT FOR SEMICONDUCTOR DEVICES

This application claims the benefit under 35 U.S.C. §119(e) of Provisional U.S. patent application Serial No. 60/123,632, filed on Mar. 10, 1999.

FIELD OF THE INVENTION

The present invention relates generally to interconnection devices, and in particular, to a temporary interconnect for a semiconductor device to be connected with a package.

BACKGROUND OF THE INVENTION

The demand for semiconductor chip packages having high lead counts and small footprints has increased. In response to this increase in demand, semiconductor manufacturers have developed ball grid arrays, flip-chip, and chip scale technology. These semiconductor devices do not use traditional wire bonds to mount the devices to a package, rather they are mounted to a package using an array of solder balls or similar electrode bumps. These semiconductor devices with electrode bumps are generally mounted to the packages with the assistance of small pads or traces that are located on the packages. Once the semiconductor devices are properly aligned and fit together, the devices are heated in a furnace that causes the electrode bumps and the traces to fuse together, thereby creating a permanent electrical connection.

A typical ball grid array or pin grid array package contains a semiconductor chip that is connected with a substrate and the semiconductor chip is wire bonded to electrical traces in the substrate. To create the complete package, the semiconductor chip is generally encapsulated with a mold material or sealed with a metal lid and the electrode bumps are bonded to the electrical traces on the bottom surface of the substrate. In a flip-chip package, the solder bumps are attached directly to the electrical traces formed in the surface of the chip. The flip-chip devices are underfilled with an underfill material to increase their reliability, but are not generally encapsulated by a molded material. Thus, flip-chip packages are extremely fragile and must be handled with great care.

A chip scale package is a combination of ball grid array packages and of flip-chip packages. A chip scale package has electrode bumps that are attached directly to electrical traces on the surface of the chip. The electrode bumps can also be attached directly to the bond pads through openings in the encapsulating material. The electrical traces connect the external electrode bumps directly to the bond pads in the chip, thereby reducing the size of the overall semiconductor chip.

The present devices and methods of interconnecting a semiconductor chip with a package include the use of some form of electrode bumps and traces. As previously stated, in practice, the semiconductor chip is attached to the package by reflowing the package together with the semiconductor chip in a furnace. A metallurgical bond forms between the semiconductor bumps and the package traces creating the desired electrical connection. In general, the furnace heats the devices to a predetermined point where the electrode bumps and package traces fuse together thereby making a permanent electrical connection.

The problem with these prior art devices and methods of connecting semiconductor chips with packages is that the traces that are used on the package and the electrode bumps of the semiconductor must be physically bonded together. As previously discussed, the devices are physically bonded together by heating the two components to the melting point of the electrode bumps and package traces. Often, designers, product engineers, or wafer process engineers want to remove the semiconductor chip from the package after they have been interconnected for failure or performance analysis. Other times, product engineers may want to evaluate different packages for performance using the same semiconductor chip. Removing the semiconductor chip from the package is extremely difficult without damaging the semiconductor chip because the electrode bumps and the package traces have been fused together during the assembly process. As such, a need exists for a temporary interconnect device or bump nest that allows easy temporary attachment and removal of semiconductor chips from package traces without having to fuse the respective interconnection devices together.

BRIEF SUMMARY OF THE INVENTION

The present invention discloses temporary interconnection methods and devices that allows the semiconductor chip to be temporarily connected with the package without having to be fused together. As such, the electrode bumps of the semiconductor chip can easily be removed from the package for analysis without damaging the semiconductor chip. In preferred embodiments, the temporary interconnect is made of gold; however, one skilled in the art would recognize that any highly conductive material may be used, such as aluminum or copper. The disclosed temporary interconnection device can be used in a wide variety of applications in the electronic industry.

The disclosed temporary interconnect includes a contact group comprising a plurality of contact elements, spaced to provide at lease one conductive interfaces with an electrode bump of a semiconductor chip. Each of the contact elements can include an encircling contact pad and a projecting contact guide. In the preferred embodiment, the contact elements are concentrically located on a base pad. The projecting contact guides and the encircling contact are spaced in a manner on the base pad so as to surround the electrode bump of the semiconductor chip and provide an electrical connection with the package.

DETAILED DESCRIPTION OF THE PREFERRED EMBODIMENTS

Figure 1:
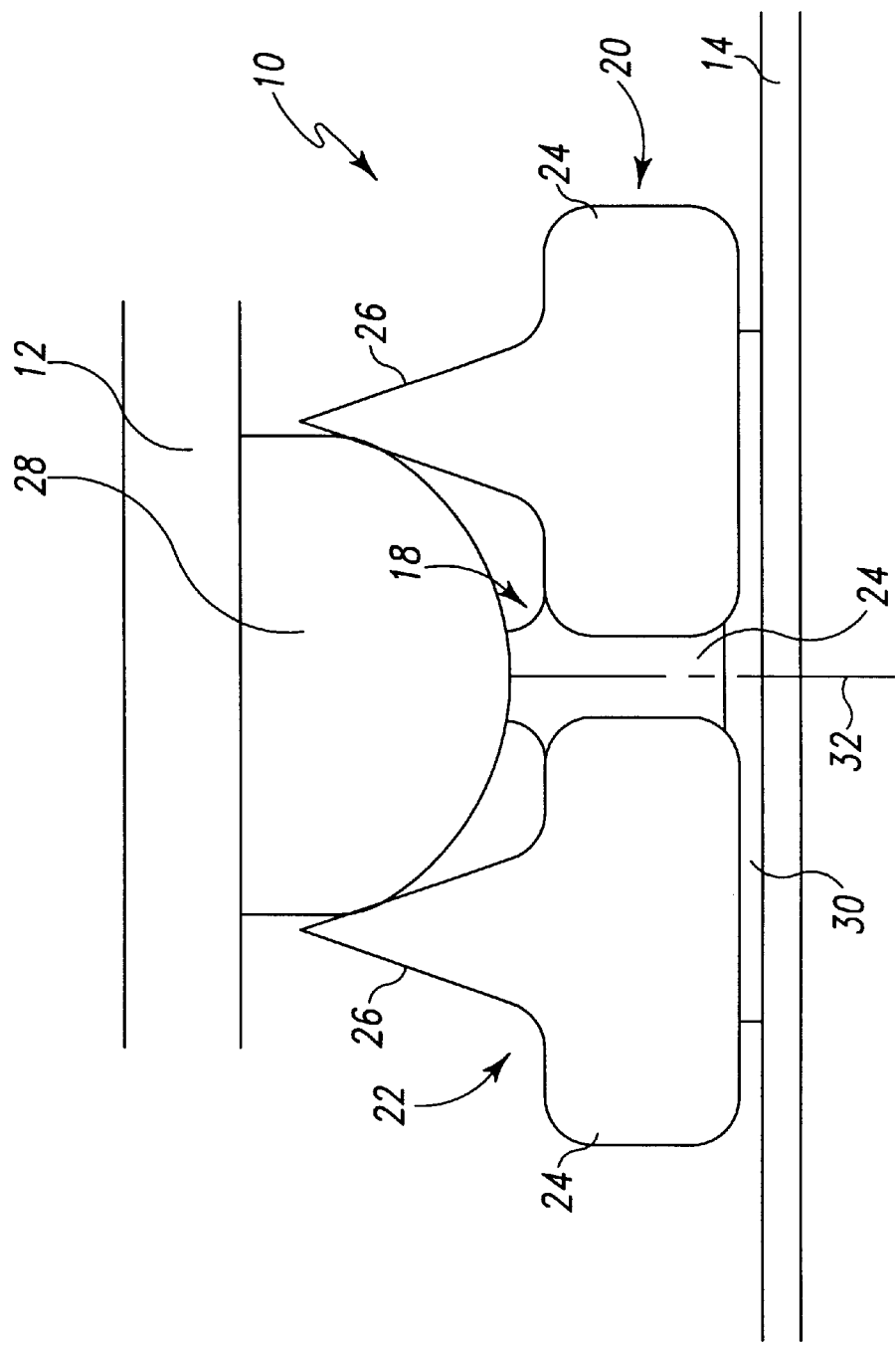
FIG. 1 illustrates a preferred embodiment of the temporary interconnect being used to connect a bumped semiconductor device with a package.
Figure 2:
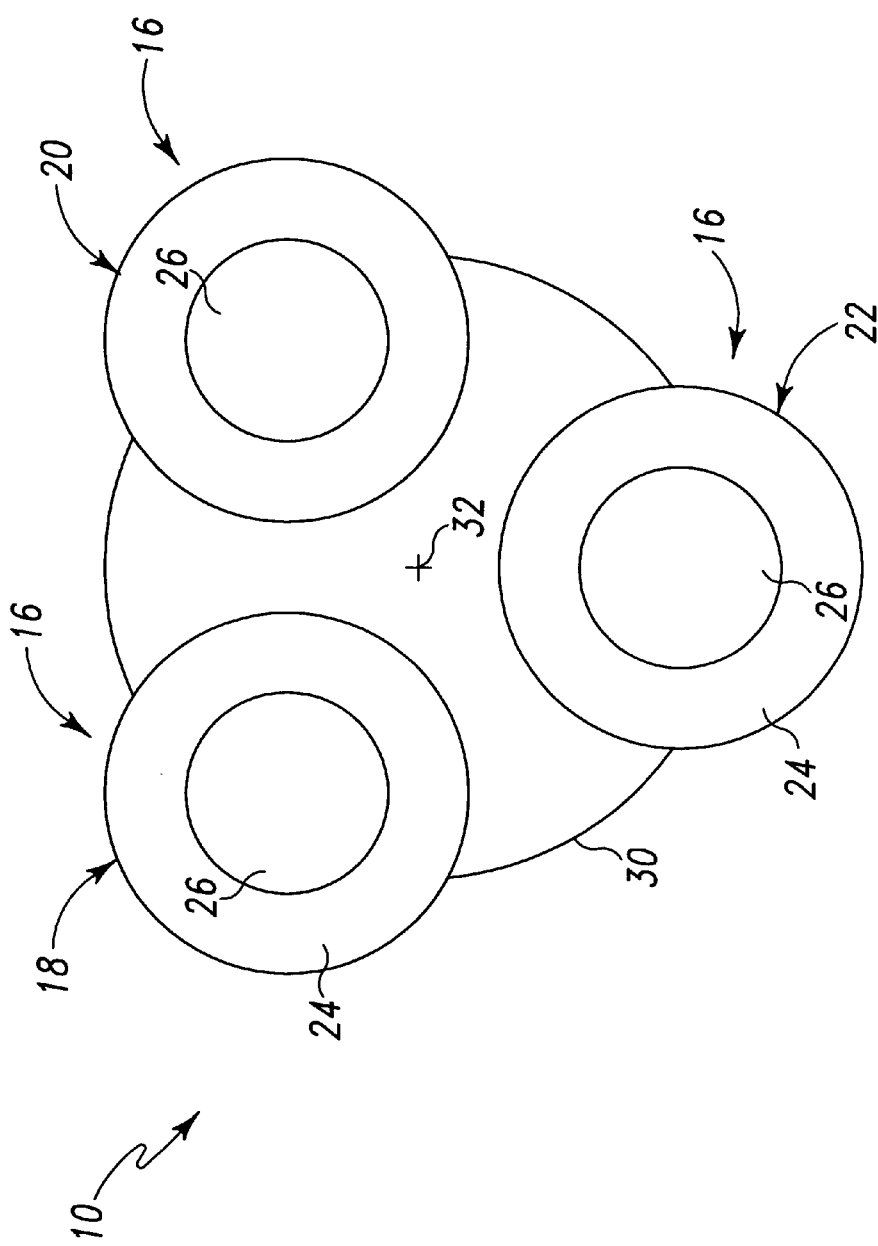
FIG. 2 depicts a top view of a preferred temporary interconnect.

As illustrated in FIG. 1, the present invention discloses a temporary interconnect 10 which gives engineers the ability to temporarily interconnect a bumped semiconductor device 12 with a package 14. In the invention, a contact group 16 (see FIG. 2) is provided which includes at least three contact elements 18, 20 and 22. Each of the respective contact elements 18, 20, and 22 includes an encircling contact 24 and a projecting contact guide 26. As depicted in FIGS. 1 and 2, the contact elements 18, 20 and 22 are spaced in such a manner so that each of the respective projecting contact guides 26 surround an electrode bump 28 of the bumped semiconductor device 12.

As disclosed in FIGS. 1 and 2, the temporary interconnect 10 may include a base pad 30 which is connected with the contact group 16. In the preferred embodiment, the contact group 16 is positioned on the base pad 30 about a central axis 32 of the base pad 30. However, one skilled in the art would recognize that the contact group 16 may be located in any manner which allows the projecting contact guides 26 to effectively engage the electrode bump 28 of a semiconductor device 12 which is to be temporarily interconnected with the package 14. In addition, the package 14 may be manufactured in such a manner that a plurality of contact groups 16 may be placed directly on the conductor traces of the package 14, thereby allowing the package traces to act as the base pad 30. However, in the disclosed preferred embodiment, the contact group 16 is located on the base pad 30 which may then be connected with the traces on the package 14.

The contact elements 18, 20 and 22 can be optimally positioned and sized to electrically connect the electrode bump 28 of the semiconductor device 12 with the package 14. The package 14 depicted in FIG. 1 is by way of example only and is not in any way meant as a limitation of the disclosed invention. Those skilled in the art would recognize that the disclosed temporary interconnect 10 can be used in any electronic application where a need exists for a device that will temporarily interconnect a bumped semiconductor device 12 with a second electronic circuit or device, such as that depicted herein as package 14. By using the disclosed invention, engineers will no longer need to heat the devices in a furnace, thereby fusing the components together to make the electrical connection between the devices.

In the disclosed preferred embodiment, each of the respective projecting contact guides 26 of the contact elements 18, 20 and 22 is generally cone shaped. In addition, each of the encircling contacts 24 is formed in a toroidal shape having upper and lower surfaces. The projecting contact guides 26 are integrally formed with the upper surface of each encircling contact 24. It should be recognized that the general shape of the projecting contact guides 26 may vary, but they will always be shaped in a manner that allows the contact elements 18, 20 and 22 to provide at least one engaging conductive interface with the bump 28 of the semiconductor device 12, and a surrounding arrangement of conically shaped guides 26 can guide and surround the bump 28 and provide a plurality of engaging electrical connections with the bump.

As previously discussed, the disclosed temporary interconnect 10 may include a base pad 30 that is connected with the contact group 12. As illustrated best in FIG. 2, the contact group 16 is preferentially positioned circumferentially around the base pad 28, each of the plurality of projecting contact guides 26 thereby being spaced at an equal distance from a central axis 32 of the base pad 30. In addition, the contact group 16 is arranged in the preferred embodiment so that the ends of the projecting contact guides 26 create an equilibrium triangle having the central axis 32 of the base pad 30 as the center of the triangle. As previously stated, one skilled in the art would recognize that the contact group 16 could be mounted directly to the traces of the package 14 using the temporary interconnect 10 without the need of a base pad 30. The traces of the package 14 could serve the same function as the base pad 30. Most packages 14 that might be used in conjunction with the present invention will have some form of traces that could be substituted for the base pad 30. However, preferentially, each temporary interconnect 10 will include the base pad 30 which in turn will be mounted to the traces on the package 14.

Figure 3:
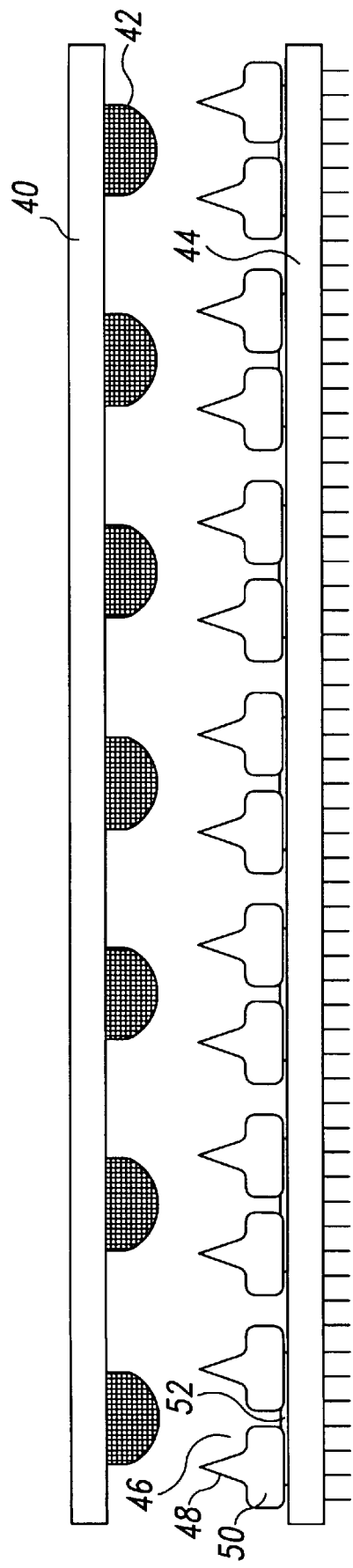
FIG. 3 is a side view of a bumped semiconductor device being temporarily interconnected with a package using a plurality of temporary interconnects.

Referring to FIG. 3, the present invention further discloses a method of temporarily interconnecting a semiconductor device 40 having a plurality of bumps 42 with a package 44. In the disclosed method, at least one temporary interconnect 46 is provided which has at least three contact elements 18, 20 and 22 (see FIG. 2). As previously set forth, each of the contact elements 18, 20 and 22 includes an integral projecting contact guide 48 that is preferentially located on an encircling contact 50. The contact elements 18, 20 and 22 are spaced to surround a respective contact 42 of the semiconductor device 40 thereby providing an electrical connection with each of the respective bumps 42.

Those skilled in the art would recognize that most packages 44 have a plurality of package traces 52 to which a plurality of temporary interconnects 46 may be connected to establish an electrical connection between the semiconductor device 40 and the package 44. As previously discussed, the contact elements 18, 20 and 22 (see FIG. 2) could be mounted directly to the package traces 52 or each respective temporary interconnect 46 could be provided with a base pad 30 which is connected with the package 44, as illustrated in FIGS. 1 and 2. In the preferred method, the plurality of bumps 42 of the semiconductor device 40 is accurately positioned for temporary electrical engagement with a respective one of the plurality of temporary interconnects 46.

While the invention has been described in its currently best known modes of operation and embodiments, other modes and embodiments of the present invention will be apparent to those skilled in the art. The invention is only limited by the claims that follow.

What is claimed is:

1. A temporary interconnect for connecting a bumped semiconductor to a package, comprising:
    a circular base pad;
    a contact group including at least three contact elements connected with said circular base pad, wherein each respective contact element includes a projecting contact guide integrally formed on an encircling contact, said at least three contacts being spaced to encompass a bump located on said bumped semiconductor to provide an electrical connection between said package and said bumped semiconductor.

2. The temporary interconnect of claim 1, wherein each of said projecting contact guides is circumferentially located from each other about an axis of the encircling base pad.

3. The temporay interconnect of claim 1, wherein said projecting contact guides are formed having a conically shaped portion.

4. The temporary interconnect of claim 1, wherein said encircling contacts are formed having a toroidal shaped portion.

5. A bump nest for interconnecting a bumped semiconductor with a package, comprising:
    a circular base pad;
    at least three contact elements connected with said circular base pad, each of said contact elements including an encircling contact and a projecting contact guide; and
    wherein said contact elements are positioned to surround a bump located on said bumped semiconductor to providing an electrical connection with said package.

6. The bump nest of claim 5, wherein said encircling contacts are formed in a toroidal shape.

7. The bump nest of claim 5, wherein each respective projecting contact guide is formed in a cone shape.

8. A temporay interconnect for connecting a bumped semiconductor with a package, comprising:

a cluster of contact pads spaced to guide a bump located on said bumped semiconductor into a conductive interface with at least one contact pad, wherein each of said contact pads includes an encircling contact with an integral projecting guide; and a circular base pad electrically connected with each respective contact pad, wherein each of said encircling contacts is spaced in an equilibrium triangle arrangement about a center axis of the circular base pad.

9. The temporary interconnect of claim 8, wherein said encircling contact is formed having a toiradal shape.

10. The temporary interconnect of claim 8, wherein said projecting contact guide is formed having a cone shape.

* * * * *